(12) United States Patent
Hashimoto et al.

(10) Patent No.: US 12,550,676 B2
(45) Date of Patent: Feb. 10, 2026

(54) METHOD OF MANUFACTURING SEMICONDUCTOR DEVICE

(71) Applicant: FUJI ELECTRIC CO., LTD., Kawasaki (JP)

(72) Inventors: Kohichi Hashimoto, Matsumoto (JP); Shunsuke Tanaka, Matsumoto (JP); Yuya Takahashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 491 days.

(21) Appl. No.: 18/305,606

(22) Filed: Apr. 24, 2023

(65) Prior Publication Data

US 2023/0411201 A1 Dec. 21, 2023

(30) Foreign Application Priority Data

Jun. 17, 2022 (JP) .................................. 2022-097720

(51) Int. Cl.
*H01L 21/683* (2006.01)
*H01L 21/288* (2006.01)
*H01L 21/304* (2006.01)
*H10D 12/00* (2025.01)

(52) U.S. Cl.
CPC ........ *H01L 21/6836* (2013.01); *H01L 21/304* (2013.01); *H01L 2221/6834* (2013.01)

(58) Field of Classification Search
CPC ......... H01L 21/6836; H01L 2221/6834; H01L 2221/68327; H10D 12/441
See application file for complete search history.

(56) References Cited

U.S. PATENT DOCUMENTS

| 2006/0019417 A1* | 1/2006 | Shigeta | ................... B24B 9/065 |
| | | | 438/690 |
| 2007/0197002 A1* | 8/2007 | Kurosawa | ......... H01L 21/67132 |
| | | | 438/460 |
| 2008/0224270 A1* | 9/2008 | Ikubo | ................ H01L 21/02068 |
| | | | 257/618 |

(Continued)

FOREIGN PATENT DOCUMENTS

| JP | 2011-222898 A | 11/2011 |
| JP | 2014-086667 A | 5/2014 |

(Continued)

*Primary Examiner* — Mohsen Ahmadi
(74) *Attorney, Agent, or Firm* — Rabin & Berdo, P.C.

(57) ABSTRACT

A method of manufacturing a semiconductor device having first and second main surfaces opposite to each other. The method includes: forming a first electrode at the first main surface of the semiconductor wafer; applying a first tape to the second main surface of the semiconductor wafer; forming roughness at a portion of a surface of the first tape; applying a second tape to an outer peripheral portion of the semiconductor wafer, so as to cover the portion of the surface of the first tape, with the roughness formed thereon, at the second main surface of the semiconductor wafer, to cover a portion of the first main surface of the semiconductor wafer, and to cover a side surface of the semiconductor wafer; heating the semiconductor wafer after the first and second tapes are applied; and subsequently forming a plated film at the surface of the first electrode by a plating treatment.

5 Claims, 10 Drawing Sheets

(56) References Cited

U.S. PATENT DOCUMENTS

| | | | |
|---|---|---|---|
| 2011/0045638 A1* | 2/2011 | Takamatsu | H01L 21/6835 |
| | | | 438/118 |
| 2011/0207294 A1* | 8/2011 | Nakanishi | H01L 21/76256 |
| | | | 438/459 |
| 2011/0256668 A1 | 10/2011 | Urano | |
| 2014/0120716 A1 | 5/2014 | Sakaguchi et al. | |
| 2016/0240504 A1 | 8/2016 | Sakaguchi | |
| 2022/0020628 A1* | 1/2022 | Takahashi | H01L 21/288 |

FOREIGN PATENT DOCUMENTS

| | | | |
|---|---|---|---|
| JP | 2014-204068 A | 10/2014 | |
| JP | 2016-152317 A | 8/2016 | |
| JP | 2022-017930 A | 1/2022 | |

* cited by examiner

| | TAPE ANNEALING CONDITIONS | ADHESIVE RESIDUE OF ADHESIVE LAYER OF PERIMETER PROTECTIVE TAPE |
|---|---|---|
| CONVENTIONAL EXAMPLE | 80°C、30 MINUTES | YES |
| EXAMPLE | 80°C、15 MINUTES | NO |
| | 60°C、15 MINUTES | NO |

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2022-097720, filed on Jun. 17, 2022, the entire contents of which are incorporated herein by reference.

BACKGROUND OF THE INVENTION

1. Field of the Invention

Embodiments of the invention relate to a method of manufacturing the semiconductor device.

2. Description of the Related Art

An insulated gate bipolar transistor (IGBT), which is a power semiconductor device, is a bipolar device that combines a bipolar junction transistor (BJT) and a metal oxide semiconductor field effect transistor (MOSFET) that has insulated gates with a three-layer structure including a metal, an oxide film, and a semiconductor. An IGBT combines high-speed switching characteristics and voltage driving control of a MOSFET with low on-voltage characteristics of a BJT.

Commonly known structures of an IGBT include structures such as a punch-through (PT) type, non-punch-through (NPT) type, and a field stop (FS). A PT-type IGBT is fabricated using an epitaxial wafer in which an n$^-$-type drift region, etc. is epitaxially grown on a p$^+$-type starting substrate that constitutes a p$^+$-type collector region; a large amount of carriers (holes) are injected into the n$^-$-type drift region from the p$^+$-type collector region, whereby low on-voltage is realized. An NPT-type IGBT and a FS-type IGBT are fabricated using a low-cost semiconductor wafer (hereinafter, FZ wafer) in which a single crystal is grown by a floating zone (FZ) method.

In the NPT-type IGBT, the p$^+$-type collector region is formed in the FZ wafer, at a back surface thereof, by ion implantation and the impurity concentration is suitably controlled, whereby carrier injection efficiency from the p$^+$-type collector region to the n$^-$-type drift region is controlled, a thickness of the n$^-$-type drift region (n$^-$-type layer of the BJT structure) is reduced, and a base transport efficiency is increased, thereby realizing reduced on-voltage. The FS-type IGBT is an improved structure of the NPT-type IGBT and realizes improved characteristics by forming, by ion implantation, an n-type FS region of an impurity concentration that is higher than that of the n$^-$-type drift region, the n-type FS region being formed between the p$^+$-type collector region and the n$^-$-type drift region, whereby the thickness of the n$^-$-type drift region, which occupies a large portion of the thickness of the semiconductor chip is reduced, thereby realizing further improvement of the characteristics.

Use of the FZ wafer enables reduction of the thickness of the FZ wafer by back surface grinding during manufacturing of the semiconductor device. Therefore, compared to an instance in which an epitaxial wafer is used in which multiple epitaxial layers of predetermined conductivity types are epitaxially grown, a product thickness (thickness of the semiconductor chip) may be significantly reduced. The thickness of the semiconductor chip is reduced, whereby heat dissipation from a main surface (for example, back surface to which a cooling structure, such as a cooling fin, is bonded via a metal base) of the semiconductor chip may be increased. A conventional method of manufacturing a semiconductor device including thinning of the semiconductor wafer is described with reference to FIG. 16.

FIG. 16 is a flowchart depicting an outline of the conventional method of manufacturing the semiconductor device. First, at the front surface of a semiconductor wafer, predetermined front-surface device structures are formed in chip regions, respectively (step S101). The chip regions are regions constituting semiconductor chips after dicing (cutting) of the semiconductor wafer. Next, the semiconductor wafer is ground (back surface grinding) from the back surface thereof to a position corresponding to a product thickness for the semiconductor device (step S102). When the size of the wafer (diameter of the semiconductor wafer) exceeds 6 centimeters (cm), due to the formation of a front electrode and thermal history of manufacturing processes, warping of the semiconductor wafer becomes prominent.

To mitigate such warping of the semiconductor wafer, for 8 cm semiconductor wafers, the semiconductor wafers are often processed so that in the back surface grinding at step S102, only the thickness of a center portion is thinned, whereby an outer peripheral portion of a predetermined width is left thick in a rib-like shape. Next, an entire area of the back surface of the semiconductor wafer is uniformly removed by etching, whereby damage occurring to the back surface of the semiconductor wafer due to the back surface grinding at step S102 is removed (step S103). Next, in the center portion of the semiconductor wafer, semiconductor regions of a predetermined conductivity type are formed in the semiconductor wafer, at the back surface thereof, by ion implantation (step S104).

Next, a heat treatment for activating the impurities ion-implanted by the processes at steps S101 and S104 is performed (step S105). Next, a hardened surface layer generated at the back surface of the semiconductor wafer due to the heat treatment at step S105 is removed (step S106). Next, the back electrode is formed in an entire area of the back surface of the semiconductor wafer (step S107). Next, a back surface protective tape for protecting the back electrode is applied at the back surface of the semiconductor wafer overall (step S108). Next, a perimeter protective tape is applied to the outer peripheral portion of the semiconductor wafer so as to cover a side surface (end) of the semiconductor wafer, from the front surface to the back surface of the semiconductor wafer (step S109).

Next, the semiconductor wafer is heated (hereinafter, tape annealing) in a state with the back surface protective tape and the perimeter protective tape applied thereto (step S110). Next, for example, a nickel (Ni) plated film and a gold (Au) plated film are sequentially formed on the front electrode of the semiconductor wafer, by a plating treatment (step S111). Next, the perimeter protective tape is peeled from the outer peripheral portion of the semiconductor wafer (step S112). Next, the back surface protective tape at the back surface of the semiconductor wafer is peeled (step S113). Thereafter, remaining processes are performed (step S114), whereby a predetermined semiconductor device is completed.

A method of applying a back surface protective tape while heating the semiconductor wafer in a range of 40 degrees C. to 60 degrees C. when performing the plating treatment to a predetermined portion of the semiconductor wafer has been proposed (for example, refer to Japanese Laid-Open Patent Publication No. 2011-222898). In Japanese Laid-Open Patent Publication No. 2011-222898, stress applied to the semiconductor wafer due to thermal contraction of the back surface protective tape as a result of the heating (tape annealing) and stress applied to the semiconductor wafer due to the formation of the plated film cancel each other out, whereby warping of the semiconductor wafer after peeling of the back surface protective tape is reduced. Further, it is disclosed that application of the back surface protective tape is performed in a vacuum, whereby the back surface protective tape may be applied to the semiconductor wafer free of air bubbles.

In a semiconductor wafer having the rib-like shape, the outer peripheral portion is left thick and thus, in processes after the plated film is precipitated at the side surface of the semiconductor wafer, may easily become a source of foreign matter and this foreign matter may further lead to poor external appearance of the back electrode. In Japanese Laid-Open Patent Publication No. 2016-152317 and Japanese Laid-Open Patent Publication No. 2014-086667, the perimeter protective tape prevents precipitation of the plated film to the side surface of the semiconductor wafer. Further, when air bubbles occur between the semiconductor wafer and the perimeter protective tape, plating solution (chemical solution) easily enters through these air bubbles. In Japanese Laid-Open Patent Publication No. 2016-152317, by pressing the perimeter protective tape to the side surface of the semiconductor wafer by applying a certain amount of pressure by a roller, adhesion between the side surface of the semiconductor wafer and the perimeter protective tape is enhanced.

As for another method of performing the plating treatment at a predetermined portion of the semiconductor wafer, a method has been proposed in which, an ultraviolet (UV) tape is used as the back surface protective tape and the perimeter protective tape, the UV tape has an adhesive layer whose adhesive strength decreases due to curing by an irradiation of UV light (for example, refer to Japanese Laid-Open Patent Publication No. 2022-017930). In Japanese Laid-Open Patent Publication No. 2022-017930, the semiconductor wafer, in a state with the back surface protective tape and the perimeter protective tape applied thereto, is heated by a temperature of 40 degrees or more (tape annealing), whereby the adhesion between the semiconductor wafer and the protective tape is increased, thereby preventing plating solution from entering between the semiconductor wafer and the protective tape.

Further, a method has been proposed in which a microstructure mold having a basic microstructure with roughness at the surface is repeatedly pressed against a curable resin deposited on a silicon (Si) wafer in advance, whereby the roughness of the basic microstructure is transferred to the curable resin on the silicon wafer (for example, refer to Japanese Laid-Open Patent Publication No. 2014-204068).

SUMMARY OF THE INVENTION

According to an embodiment of the invention, a method of manufacturing a semiconductor device having a first main surface and a second main surface that is opposite to the first main surface, the method includes: as a first process, forming a first electrode at the first main surface of the semiconductor wafer; as a second process, applying a first tape to cover the second main surface of the semiconductor wafer; as a third process, forming roughness at a portion of a surface of the first tape; as a fourth process, applying a second tape to an outer peripheral portion of the semiconductor wafer, so as to cover the portion of the surface of the first tape, at which the roughness is formed in the third process, at the second main surface of the semiconductor wafer, to cover a portion of the first main surface of the semiconductor wafer, and to cover a side surface of the semiconductor wafer; as a fifth process, heating the semiconductor wafer after the first tape and the second tape are applied; and as a sixth process, forming a plated film at the surface of the first electrode by a plating treatment after the fifth process.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. In the method of manufacturing the semiconductor device described above (refer to FIG. 16), after the back surface protective tape and the perimeter protective tape are sequentially applied (step S108, S109) to the semiconductor wafer, in the plating treatment (step S111) thereafter, the semiconductor wafer is exposed to the plating solution for a long period. For example, at step S111, in an instance in which an electroless plating treatment is performed, the semiconductor wafer is exposed to the plating solution of a temperature in a range of 70 degrees C. to 80 degrees C. for about 40 minutes to 50 minutes. When air bubbles occur between the semiconductor wafer and the protective tape, the air bubbles are heated by the plating solution and become larger.

When air bubbles between the semiconductor wafer and the protective tape become larger, the air bubbles tend to become paths of entry of the plating solution, whereby precipitation of the plated film at a portion that should be free of the plated film may occur, poor external appearance of the back electrode due to an etching action by the plating solution may occur, etc. For example, as with Japanese Laid-Open Patent Publication No. 2011-222898 and Japanese Laid-Open Patent Publication No. 2022-017930, while the tape annealing is performed with or after application to the semiconductor wafer, depending on the adhesive layer, the adhesive layer of the protective tape becomes soft and microscopic gaps become embedded between the semiconductor wafer and the protective tape, whereby the protective tape can be applied free of air bubbles, the following problems occur.

Figure 15:
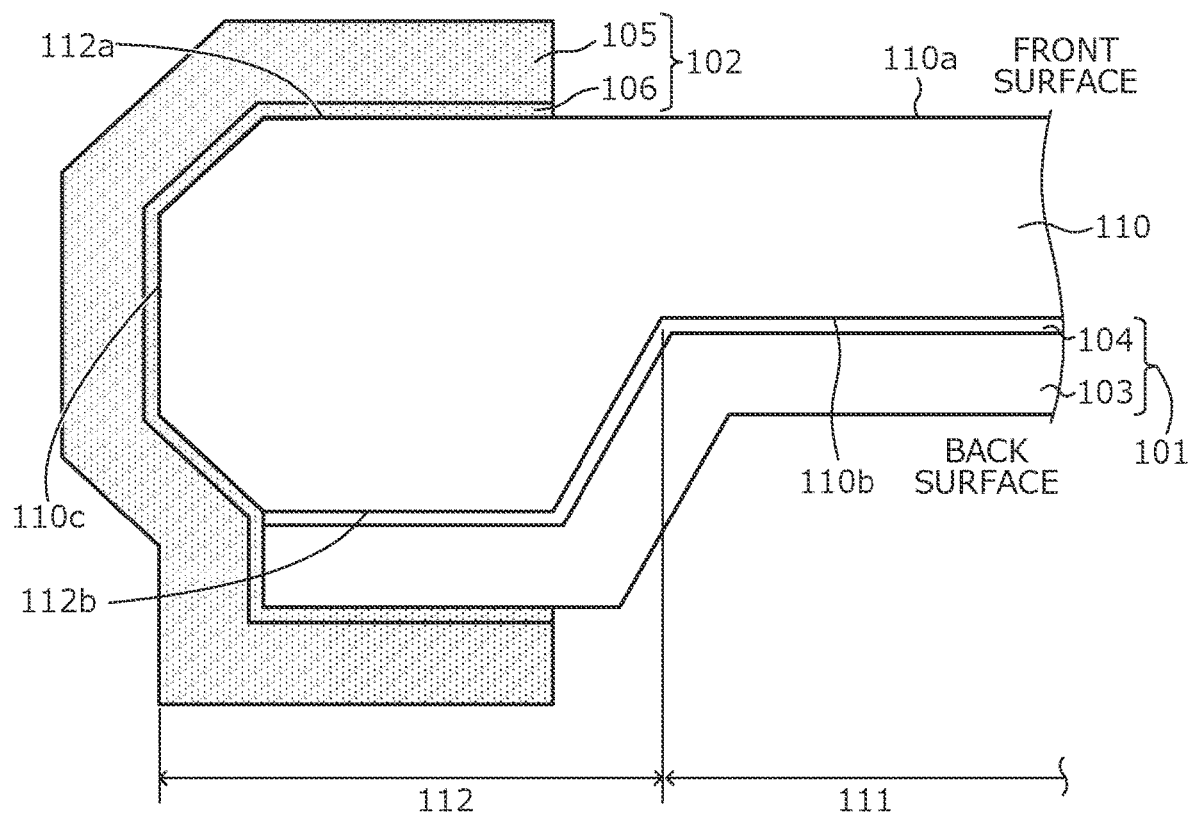
FIG. 15 is a diagram for describing problems associated with a conventional method of manufacturing a semiconductor device.

FIG. 15 is a diagram for describing problems associated with the conventional method of manufacturing a semiconductor device. FIG. 15 depicts a portion close to an outer peripheral portion 112 of a semiconductor wafer 110 that has a rib-like shape. As depicted, in the semiconductor wafer 110 with a rib-like shape, only a center portion 111 is thinned while the outer peripheral portion 112 thick and thus, the plated film precipitated at a side surface 110c becomes a source of foreign matter at subsequent processes. Therefore, after a back surface protective tape 101 is applied to an entire area of the back surface 110b of the semiconductor wafer 110, a perimeter protective tape 102 is applied to the side surface 110c of the semiconductor wafer 110. The back surface protective tape 101 is configured by a base material layer 103 and an adhesive layer 104.

The perimeter protective tape 102 is applied spanning a front surface 110a and the back surface 110b of the semiconductor wafer 110. At the back surface 110b of the semiconductor wafer 110, the perimeter protective tape 102 is applied to the back surface protective tape 101 that is on a surface (hereinafter, back surface of the outer peripheral portion 112) 112b of the outer peripheral portion 112 of the semiconductor wafer 110. The perimeter protective tape 102 is configured by a base material layer 105 and an adhesive layer 106 and while adhered to the base material layer 103 of the back surface protective tape 101 by the adhesive layer 106, the adhesion thereof is between resin layers and thus, in terms of material properties, the adhesion is low and to prevent entry of the plating solution and peeling of the tape during the plating treatment, the adhesion has to be enhanced by the tape annealing.

On the other hand, at the front surface 110a of the semiconductor wafer 110, the perimeter protective tape 102 is applied directly to a surface (hereinafter, front surface of the outer peripheral portion 112) 112a of the outer peripheral portion 112 of the semiconductor wafer 110. Due to the state of the front surface 112a of the outer peripheral portion 112 of the semiconductor wafer 110, adhesion of the perimeter protective tape 102 to the front surface 112a is high and tape annealing may be unnecessary. In this instance, when the tape annealing is performed to enhance the adhesion of the perimeter protective tape 102 at the back surface 110b of the semiconductor wafer 110, adhesion of the perimeter protective tape 102 at the front surface 110a of the semiconductor wafer 110 becomes excessively high.

A state of high adhesion of the perimeter protective tape 102, for example, is an instance in which on the front surface 112a of the outer peripheral portion 112 of the semiconductor wafer 110, only a single layer film (inorganic material film such as an oxide film) is provided, an instance in which a silicon surface of the semiconductor wafer 110 is exposed at the front surface 112a of the outer peripheral portion 112 of the semiconductor wafer 110, an instance in which the front surface 112a is substantially free of unevenness even when an inorganic material film such as an oxide film or an organic insulating film such as a passivation film is stacked on the front surface 112a of the outer peripheral portion 112 of the semiconductor wafer 110, and a state in which the front surface 112a of the outer peripheral portion 112 of the semiconductor wafer 110 is flat.

When the adhesion of the perimeter protective tape 102 at the front surface 110a of the semiconductor wafer 110 is excessively high, the perimeter protective tape 102 becomes difficult to peel at step S112 and a portion of the adhesive layer 106 of the perimeter protective tape 102 may be left on the front surface 110a of the semiconductor wafer 110. Subsequently, in the process (peeling of the back surface protective tape 101) at step S113, when the semiconductor wafer 110 is placed on a non-depicted stage, with the front surface 110a thereof facing downward (facing the stage), the semiconductor wafer 110 may become adhered to the stage by residue (adhesive residue) of the adhesive layer 106 on the front surface 110a and may be damaged when transported from the stage.

Embodiments of a method of manufacturing a semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
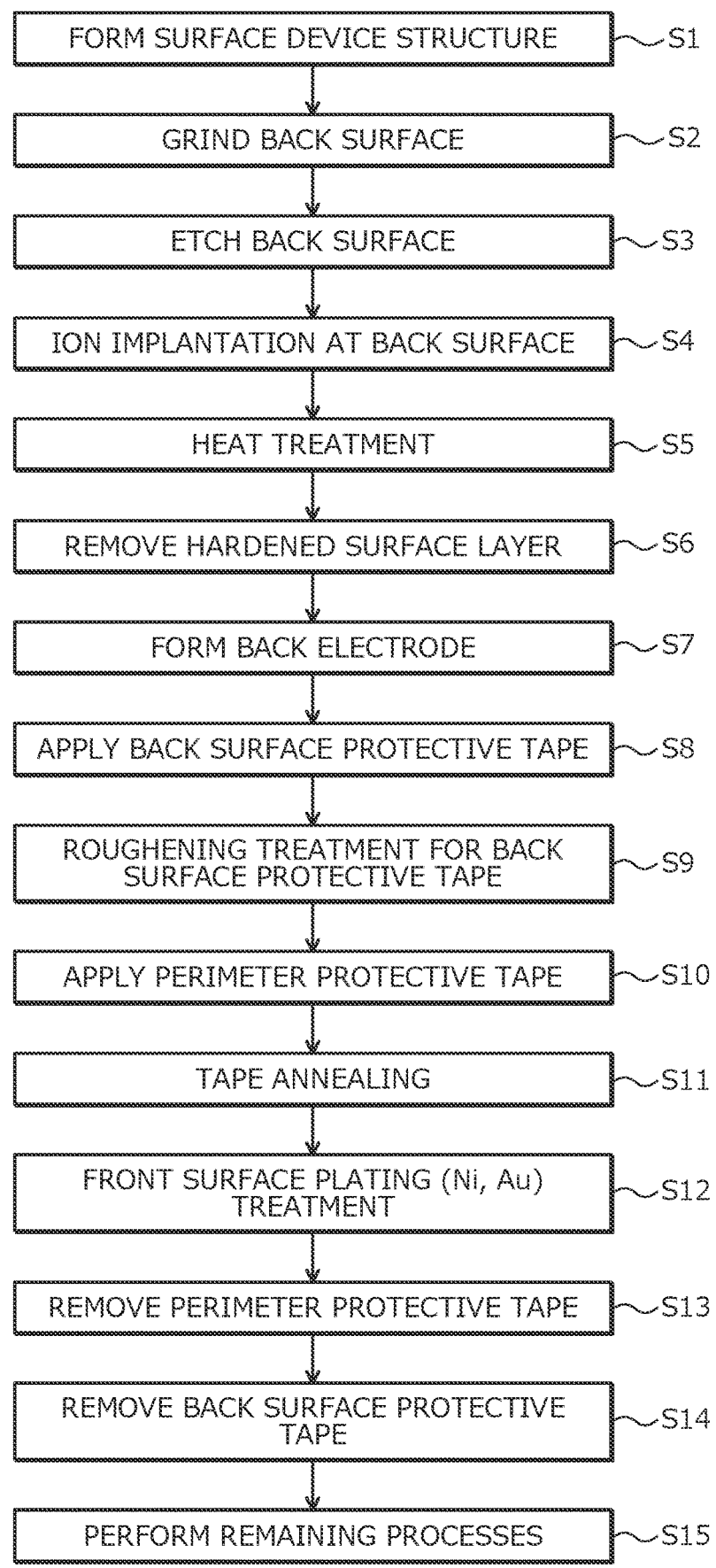
FIG. 1 is a flowchart depicting an outline of a method of manufacturing a semiconductor device according to an embodiment.
Figure 2:
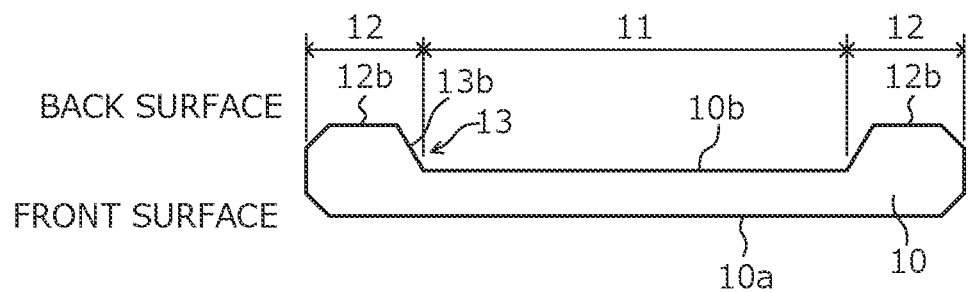
FIG. 2 is a cross-sectional view of a state of the semiconductor device according to the embodiment during manufacture.
Figure 3:
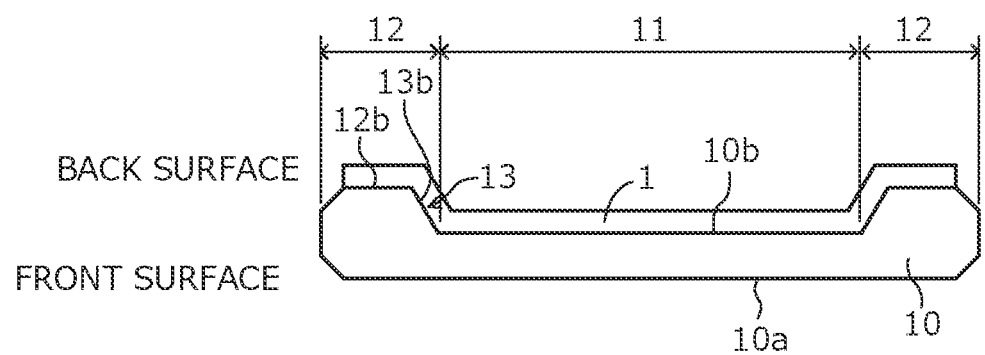
FIG. 3 is a cross-sectional view of a state of the semiconductor device according to the embodiment during manufacture.
Figure 4:
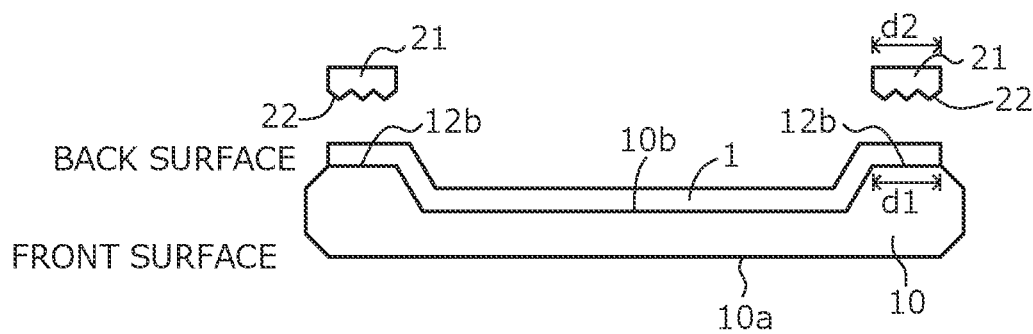
FIG. 4 is a cross-sectional view of a state of the semiconductor device according to the embodiment during manufacture.
Figure 5:
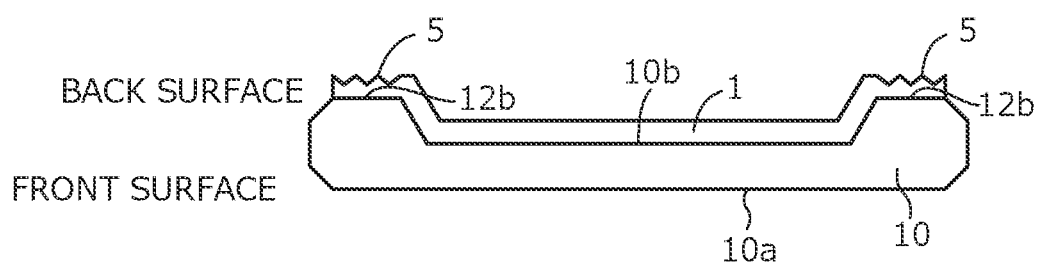
FIG. 5 is a cross-sectional view of a state of the semiconductor device according to the embodiment during manufacture.
Figure 6:
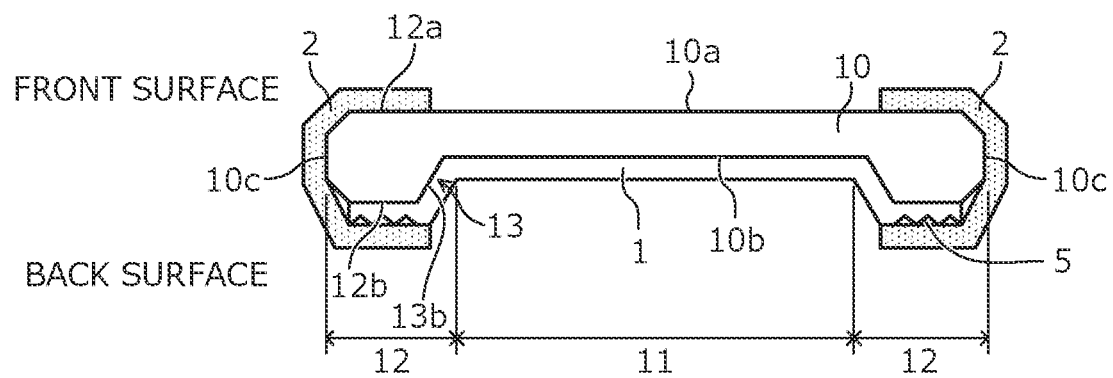
FIG. 6 is a cross-sectional view of a state of the semiconductor device according to the embodiment during manufacture.
Figure 7:
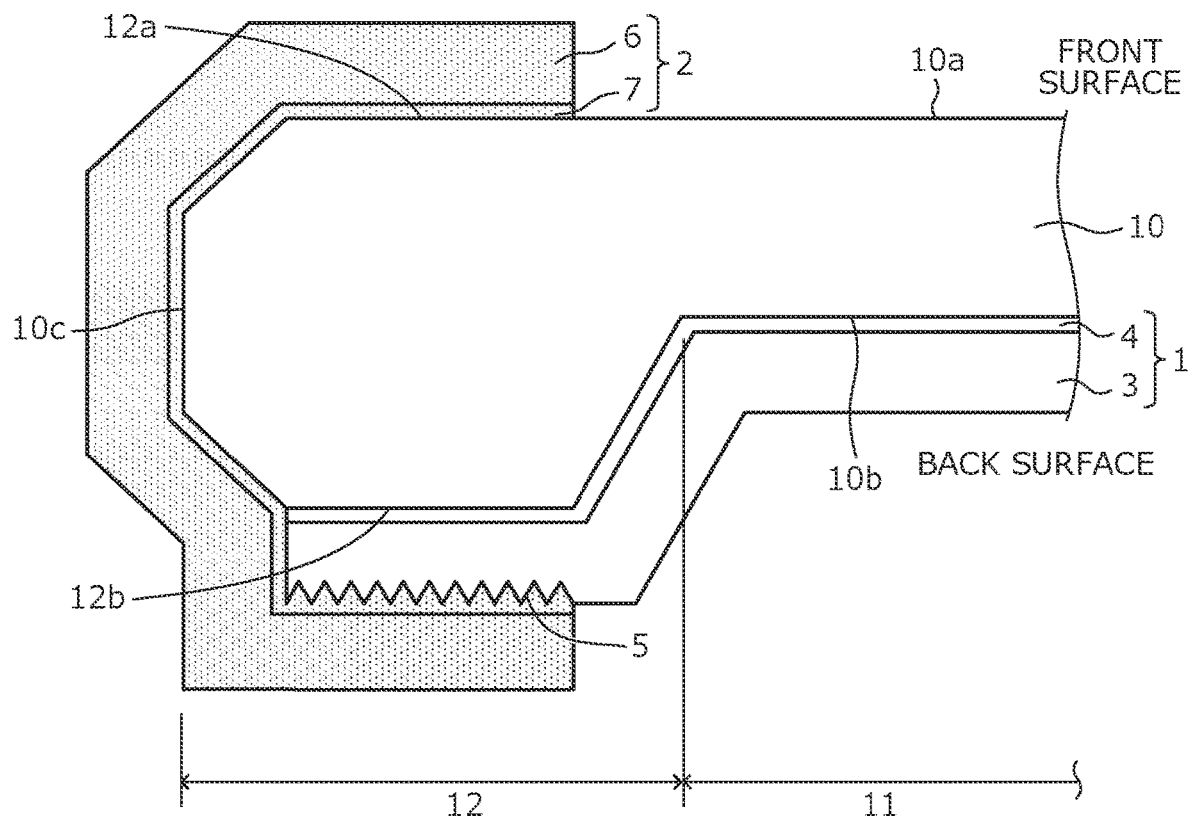
FIG. 7 is a cross-sectional view of a state of the semiconductor device according to the embodiment during manufacture.
Figure 8:
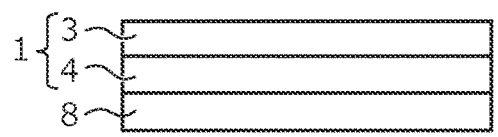
FIG. 8 is a cross-sectional view of a layered structure of a back surface protective tape used at step S8 in FIG. 1.

A method of manufacturing a semiconductor device according to an embodiment is described. FIG. 1 is a flowchart depicting an outline of the method of manufacturing the semiconductor device according to the embodiment. FIGS. 2, 3, 4, 5, 6, and 7 are cross-sectional views of states of the semiconductor device according to the embodiment during manufacture. FIGS. 2, 3, and 6 depict the semiconductor wafer 10 during processes at step S3, step S8, and step S10 in FIG. 1, respectively. FIGS. 4 and 5 depict the semiconductor wafer 10 during a process at step S9 in FIG. 1. FIG. 7 depicts an enlarged view of a vicinity of an outer peripheral portion 12 of the semiconductor wafer 10 in FIG. 6, FIG. 8 is a cross-sectional view of a layered structure of a back surface protective tape used at step S8 in FIG. 1.

Figure 9:
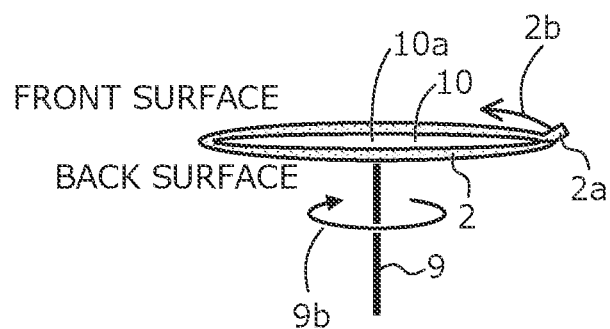
FIG. 9 is a perspective view depicting a state of the semiconductor device according to the embodiment during manufacture.
Figure 10:
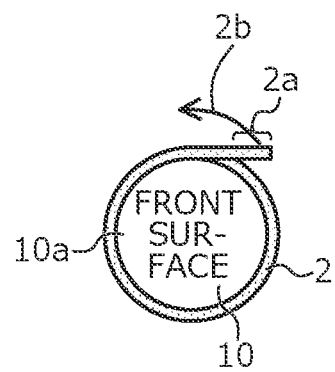
FIG. 10 is a plan view depicting a state of the semiconductor device according to the embodiment during manufacture.
Figure 11:
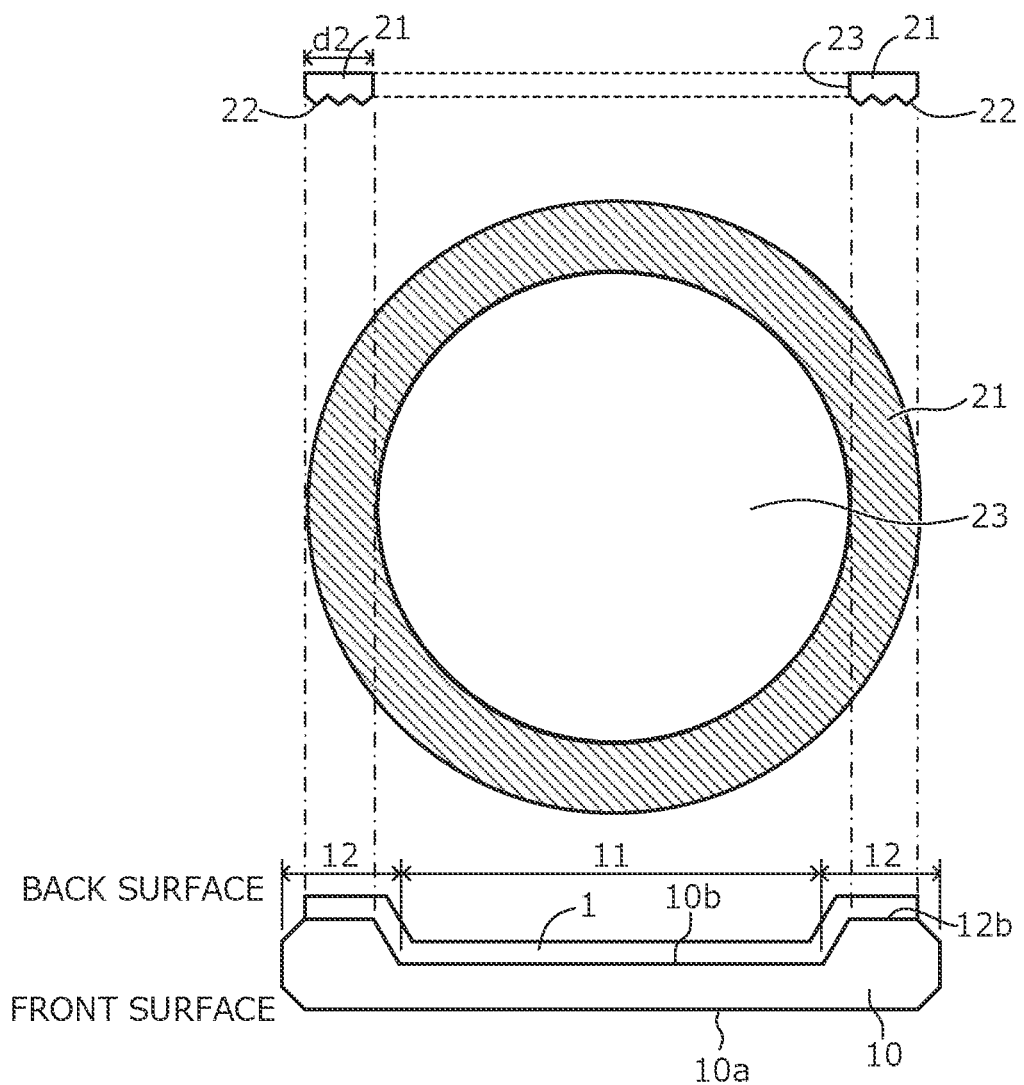
FIG. 11 is a diagram for describing a structure of a mold used at step S9 in FIG. 1.
Figure 12:
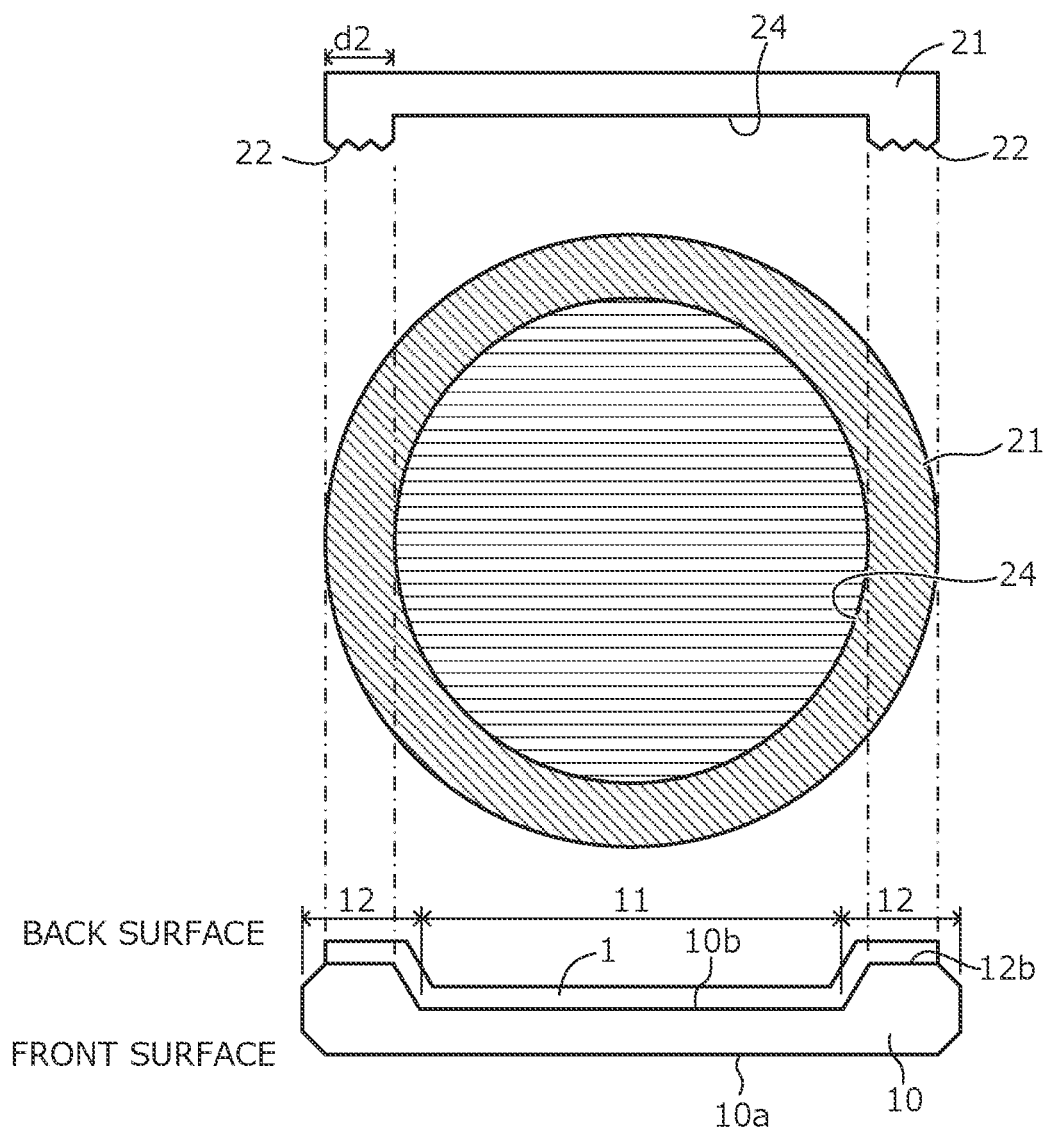
FIG. 12 is a diagram for describing another example of the structure of the mold used at step S9 in FIG. 1.
Figures 13, 14:
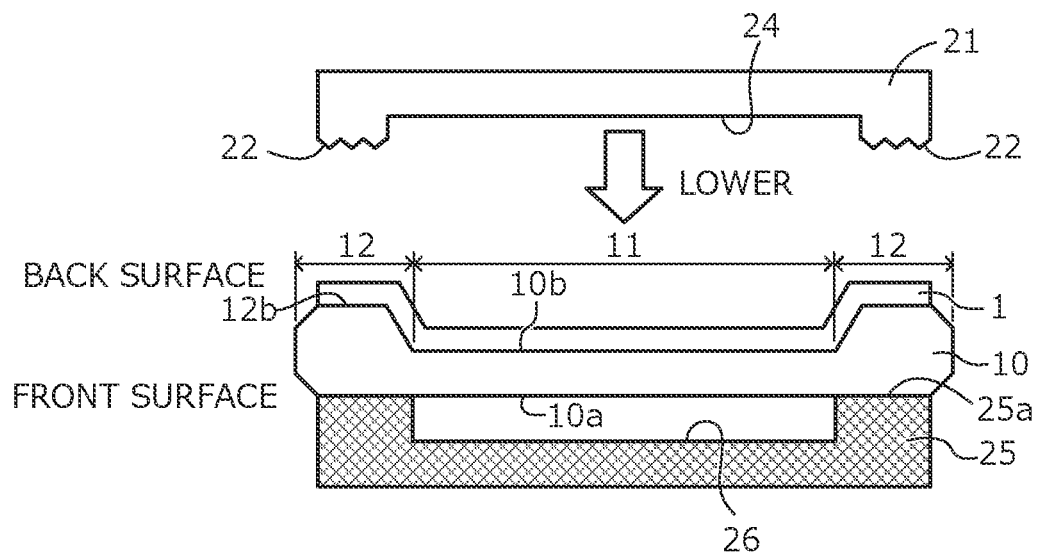
FIG. 13 is a diagram for describing another example of the structure of the mold used at step S9 in FIG. 1.
FIG. 14 is a table depicting a relationship between tape annealing conditions and adhesive residue of an adhesive layer of a perimeter protective tape.

FIG. 9 is a perspective view depicting a state of the semiconductor device according to the embodiment during manufacture. FIG. 10 is a plan view depicting a state of the semiconductor device according to the embodiment during manufacture. FIGS. 9 and 10 depict the semiconductor wafer 10 during a process at step S13 in FIG. 1. FIG. 11 is a diagram for describing a structure of a mold used at step S9 in FIG. 1. FIGS. 12 and 13 are diagrams for describing another example of the structure of the mold used at step S9 in FIG. 1. FIGS. 11 and 12 are diagrams depicting a cross-section of a mold 21 and the semiconductor wafer 10 relative to a plan view of the mold 21. In FIGS. 6, 7, 9, and 10, a perimeter protective tape 2 is indicated by hatching.

First, as depicted in FIG. 2, at a front surface (first main surface) 10a of the semiconductor wafer 10 containing silicon (Si) as a material, non-depicted predetermined front-surface device structures are formed in non-depicted chip regions, by a general method (step S1: first process). The semiconductor wafer for example, is a FZ wafer in which a single crystal is grown by a FZ method. The chip regions are regions that constitute semiconductor chips after dicing (cutting) of the semiconductor wafer 10. The predetermined front-surface device structures are functional portions for obtaining functions of the semiconductor device and are configured by parts of the semiconductor wafer at the front surface 10a thereof, a front electrode (first electrode) and an insulating layer (interlayer insulating film, passivation film) on the front surface of the semiconductor wafer 10, etc.

Parts of the semiconductor wafer 10, at the front surface 10a thereof, for example, are parts of a bipolar transistor, an IGBT, MOS gates of a MOSFET, an anode region of a diode, etc. The front electrode is a surface electrode formed by a single or multiple metal layers constituting an electrode pad to which a terminal (for example, a terminal pin, a copper foil plate) for external connection is soldered and, for example, is an emitter electrode of a bipolar transistor or an IGBT, a source electrode of a MOSFET, an anode electrode of a diode, etc. A portion of the front surface 10a of the semiconductor wafer 10, excluding a portion where the electrode pad of the front electrode is formed, is covered by the insulating layer.

Next, only a center portion 11 of the semiconductor wafer 10, which has a substantially uniform thickness, is ground from a back surface 10b of the semiconductor wafer 10 (back-grinding) to a position corresponding to a product thickness for the semiconductor device (back surface grinding), thereby reducing the thickness of the center portion 11 (step S2). As a result, in the semiconductor wafer 10, only the thickness of the center portion 11 thinned and the outer peripheral portion 12 of a predetermined width is left thick along the perimeter of the semiconductor wafer 10 and has a rib-like shape. A substantially uniform thickness means the same thickness within a range that includes an allowable error due to process variation. A side surface 10c of the semiconductor wafer 10 may be chamfered.

After the back surface grinding at step S2, at the back surface 10b of the semiconductor wafer 10, a recess 13 occurs due to the difference in the thickness of the center portion 11 and the thickness of the outer peripheral portion 12. A portion from the recess 13 of the semiconductor wafer 10 to the side surface (end) 10c is the outer peripheral portion 12 of the semiconductor wafer 10. The outer peripheral portion 12 of the semiconductor wafer 10, during the manufacture of the semiconductor device, acts as a reinforcing member for maintaining the strength of the semiconductor wafer 10. When the size of the wafer (diameter of the semiconductor wafer 10) exceeds 6 cm, warping of the semiconductor wafer 10 due to the thermal history of the formation of the front electrode, manufacturing processes, etc. becomes prominent and thus, a semiconductor wafer having a rib-like shape is useful.

The outer peripheral portion 12 of the semiconductor wafer 10 is free of chip regions. At the front surface 10a of the semiconductor wafer 10, a surface (hereinafter, the front surface of the outer peripheral portion 12) 12a of the outer peripheral portion 12 has a high degree of flatness. The front surface 12a of the outer peripheral portion 12 of the semiconductor wafer 10 having a high degree of flatness is a state in which only a single layer film (inorganic material film such as an oxide film) is provided on the front surface 12a, or a state in which the silicon surface of the semiconductor wafer 10 is exposed at the front surface 12a, or a state in which on the front surface 12a, an inorganic material film and an organic insulating film (passivation film, etc.) are stacked and the front surface 12a is substantially free of unevenness.

A portion (hereinafter, back surface flat portion of the outer peripheral portion 12 of the semiconductor wafer 10) 12b of the back surface 10b of the semiconductor wafer 10, closer to the chip end (the side surface 10c) than is the recess 13 is left a flat surface. A width (width in a radial direction from the center to the end of the semiconductor wafer 10: ring width) d1 of the back surface flat portion 12b of the outer peripheral portion 12 of the semiconductor wafer 10 is, for example, about 3 mm. At the back surface 10b of the semiconductor wafer 10, a portion (mesa edge of the recess 13) 13b between the center portion 11 and the back surface flat portion 12b of the outer peripheral portion 12 may be a surface that is sloped with respect to the back surface 10b so that the thickness of the semiconductor wafer 10 gradually becomes thicker in a direction from the center (the center portion 11) to the chip end.

Next, by etching, an entire area of the back surface 10b of the semiconductor wafer 10 is uniformly peeled, whereby damage occurring to the back surface 10b of the semiconductor wafer 10 due to the back surface grinding at step S2 is removed (step S3). Etching for removing the damage may be performed using a chemical solution. Next, by ion implantation, a non-depicted semiconductor region of a predetermined conductivity type is formed in the semiconductor wafer 10, at the back surface 10b thereof, in the center portion 11 of the semiconductor wafer 10 (step S4). The semiconductor region of the predetermined conductivity type formed in the semiconductor wafer 10, at the back surface 10b thereof may be, for example, a buffer region, an FS region, collector region of a bipolar transistor or an IGBT, a drain region of a MOSFET, or a cathode region of a diode.

Next, a heat treatment for activating the impurities ion-implanted by the processes at steps S1 and S4 is performed (step S5). Next, a hardened surface layer generated at the back surface 10b of the semiconductor wafer 10 by the heat treatment at step S5 is removed (step S6). Next, a non-depicted back electrode is formed in an entire area of the back surface 10b of the semiconductor wafer 10, spanning the center portion 11, the mesa edge 13b of the recess 13, and the back surface flat portion 12b of the outer peripheral portion 12 (step S7). The back electrode is, for example, a collector electrode of a bipolar transistor or an IGBT, a drain electrode of a MOSFET, or a cathode electrode of a diode.

The back electrode is a surface electrode formed by a single layer or a multi-layer metal layer and, for example, is a stacked layer at least any one of an aluminum (Al) layer, a titanium (Ti) layer, a nickel (Ni) layer, and a gold (Au) layer formed by a chemical vapor deposition (CVD) method, a physical vapor deposition (PVD) method, etc. With consideration of an assembly process for mounting individual non-depicted semiconductor chips into which the semiconductor wafer 10 is diced in a non-depicted module, the uppermost layer of the back electrode may preferably be an Au layer.

Next, as depicted in FIG. 3, the semiconductor wafer 10 is placed on a non-depicted stage for applying the back surface protective tape, the semiconductor wafer 10 being placed with the front surface 10*a* facing downward (toward the stage). Next, in a vacuum chamber under a vacuum state (pressure lower than atmospheric pressure), a back surface protective tape (first tape) 1 is applied to an entire area of the back surface 10*b* of the semiconductor wafer 10 (entire area of the surface of the back electrode), by an adhesive layer 4 (refer to FIG. 7) (step S8: second process). Next, the vacuum chamber is opened to the atmospheric pressure and by mechanically pressing the back surface protective tape 1 to the back surface 10*b* of the semiconductor wafer 10 by a non-depicted roller, adhesion between the semiconductor wafer 10 and the back surface protective tape 1 is increased.

As a result, at the back surface 10*b* of the semiconductor wafer 10, spanning the center portion 11 of the semiconductor wafer 10, the mesa edge 13*b* of the recess 13, and the back surface flat portion 12*b* of the outer peripheral portion 12, the back surface protective tape 1 is applied to an entire area of the surface of the back electrode, whereby the back electrode is covered and protected by the back surface protective tape 1. Processes from those at step S8 to later-described step S14 may be performed before the process (back electrode formation) at step S7. In this instance, the process at step S8 is performed after the process at step S5, or after the process at step S6 and thus, the back surface protective tape 1 is applied directly to an entire area of the back surface 10*b* of the semiconductor wafer 10.

The back surface protective tape 1, for example, has a circular shape of a size (diameter) slightly smaller than the size of the wafer, in a plan view. The back surface protective tape 1 having a size slightly smaller than is the size of the wafer, for example, means that the back surface protective tape 1 has a diameter such that when adhered to the back surface 10*b* of the semiconductor wafer 10, the back surface protective tape 1 covers substantially an entire area of the back surface flat portion 12*b* and does not extend beyond the side surface 10*c* of the semiconductor wafer 10, in a direction substantially parallel to the back surface 10*b* of the semiconductor wafer 10. While an end of the back surface protective tape 1 may preferably be aligned with and overlap an outer periphery of the back surface flat portion 12*b* of the outer peripheral portion 12 of the semiconductor wafer 10, the end may protrude from the outer periphery of the back surface flat portion 12*b*, into a chamfering portion of the side surface 10*c*.

The back surface protective tape 1 has a layered structure in which the adhesive layer 4 is stacked on a base material layer 3, (refer to FIG. 7, in FIGS. 3 to 6, 11 to 13, layered structure of the base material layer 3 and the adhesive layer 4 is not depicted), and a surface (adhesive surface) having the adhesive layer 4 is adhered to the semiconductor wafer 10. As the back surface protective tape 1, a commercial tape that is heat resistant, chemical resistant, and developed for plating treatment processes may be used. A total thickness of the back surface protective tape 1 is relatively thin and, for example, about 56 µm±5 µm. Before use, the back surface protective tape 1, for example, is stored rolled with a protective film 8 therebetween (refer to FIG. 8).

The base material layer 3 is a pressure-sensitive tape that is flexible to an extent that roughness 5 is formed at the surface thereof and the base material layer 3 has plasticity to maintain the shape of the roughness 5, in the process at later-described step S9. Further, the base material layer 3 is a barrier film containing resin that is heat resistant and chemical resistant with respect to the plating solution used in the plating treatment at later-described step S12. The base material layer 3 is permeable to ultraviolet rays (UV). In particular, the base material layer 3, for example, is a special polyester film processed to have these special functions (chemical resistance, heat resistance, plasticity, UV permeability). A thickness of the base material layer 3 is, for example, about 30 µm (in particular, may be about 26 µm±2 µm).

The adhesive layer 4 is formed by adhesive (resin) that is cured by UV irradiation thereby reducing the adhesive strength thereof. In particular, the adhesive layer 4, for example, is formed by a special acrylic-based adhesive processed to have a special function (such as self-peeling with UV exposure). A thickness of the adhesive layer 4 is, for example, about 30 µm±3 µm. The protective film 8 is a separator that covers and separates the adhesive surface (surface of the adhesive layer 4) to prevent the adhesive surface from adhering to the surface of the back surface protective tape 1 while the back surface protective tape 1 is in a rolled state before use and is peeled from the back surface protective tape 1 immediately before use. The protective film 8 is, for example, a polyester (polyethylene terephthalate (PET)) film with a mold-releasing property.

Next, as depicted in FIG. 4, the semiconductor wafer 10 is placed on a stage 25 for a roughening treatment, the semiconductor wafer 10 is placed with the front surface 10*a* facing downward (refer to FIG. 13). Subsequently, the mold 21 is placed above the semiconductor wafer 10, facing the back surface 10*b* of the semiconductor wafer 10. In FIG. 13, while the mold 21 in FIG. 12 is used, the mold 21 in FIG. 11 may be used. In a plan view, the mold 21 has a circular shape of a slightly smaller size (diameter) than the size of the wafer (refer to FIGS. 11 and 12). The mold 21 has, at a surface thereof facing the semiconductor wafer 10, a ring-shaped area of roughness 22 facing an entire area of the back surface flat portion 12*b* of the outer peripheral portion 12 of the semiconductor wafer 10.

The mold 21, for example, may be a thin metal plate having, in a plan view, a circular shape in which a center portion is a hollow portion 23, thereby forming a ring-shape where the roughness 22 is formed (refer to FIG. 11); the mold 21 may be a thin metal plate having, in a plan view, a circular shape in which a recess 24 is formed at a surface thereof facing which the semiconductor wafer 10 so that only the center portion of the thin metal plate has a relatively thinner thickness and the outer peripheral portion of a predetermined width (width in the radial direction from the center of the mold 21 to an end of the mold 21: ring width of the roughness 22 portion) d2 is left in a thick rib-like shape (refer to FIG. 12). The mold 21 has a rib-like shape, whereby, for example, even when applied to the semiconductor wafer 10 having a large diameter of 8 inches are more, the strength of the mold 21 may be ensured.

Further, at the center portion of the mold 21, the hollow portion 23 is provided (FIG. 11) or the recess 24 is formed (FIG. 12), whereby even when warping of the semiconductor wafer 10 occurs, during embossing by the later-described mold 21, the mold 21 enables contact with the center portion 11 (which has a thin thickness) of the semiconductor wafer 10 and application of stress to be eliminated. The mold 21 suffices to be concave to an extent that the recess 24 does not contact the thin center portion 11 of the semiconductor wafer 10, and in an instance in which the thickness of the mold 21 is in a range of 4 mm to 5 mm, at the center portion of the mold 21, for example, the recess 24 of a depth in a range of about 1.0 mm to 1.5 mm suffices to be formed. Compared to an instance in which the hollow portion 23 is at the center portion of the mold 21 (FIG. 11), in an instance of the recess 24 (FIG. 12), strength of the mold 21 is easily increased and the roughness 5 is more uniformly formed at the surface of the base material layer 3 of the back surface protective tape 1 during the embossing by the mold 21. Further, in an instance in which warping of the semiconductor wafer 10 does not occur, while not depicted, the mold 21 may be such that, for example, in a thin metal plate having a circular shape in a plan view, the roughness 22 is formed in a ring-shaped area that faces an entire area of the back surface flat portion 12b of the outer peripheral portion 12 of the semiconductor wafer 10.

In a cross-sectional view, the shape of the roughness 22 is not limited to a triangular shape and may be suitably set, provided a predetermined range of the surface of the base material layer 3 of the back surface protective tape 1 may be roughened by the roughness 22 to a predetermined maximum height Ry. A pattern of the roughness 22 may be suitably set, and preferably may be a regular pattern enabling the roughness 5 to be formed to an extent that a later-described anchor effect is obtained in a predetermined range of the surface of the base material layer 3 of the back surface protective tape 1, even when misalignment of the mold 21 occurs. For example, the pattern of the roughness 22 may be a pattern in which recessed portions (or protruding portions) are disposed in concentric shapes surrounding a periphery of the center portion of the mold 21 or in a matrix-like pattern. A ring width d2 of the area of the roughness 22 is substantially equal to a width d1 of the back surface flat portion 12b of the outer peripheral portion 12 of the semiconductor wafer 10.

Next, as depicted in FIG. 5, the roughness 22 of the mold 21 is embossed on the back surface protective tape 1 (embossing process), whereby the roughness 5, which is fine, is formed only at the surface of the base material layer 3 of the back surface protective tape 1 on the back surface flat portion 12b of the outer peripheral portion 12 of the semiconductor wafer 10 (step S9: third process). Preferably, the process at step S9, for example, may be performed in the vacuum chamber in which the process at step S8 is performed. Preferably, the roughness 5 is formed in substantially an entire area of the surface of the base material layer 3 of the back surface protective tape 1 on the back surface flat portion 12b of the outer peripheral portion 12 of the semiconductor wafer 10. Conditions (cross-sectional shape, height difference between protruding portions and recessed portions, repetition pitch of the protruding portions and recessed portions, etc.) for the roughness 5 formed at the surface of the base material layer 3 of the back surface protective tape 1 may be suitably set.

For example, when the recessed portions of the roughness 5 penetrate through the base material layer 3, during the plating treatment at later-described step S12, plating solution may enter between the semiconductor wafer 10 and the back surface protective tape 1 and thus, preferably, the height difference of the roughness 5 formed in the base material layer 3 may be less than the thickness of the base material layer 3 of the back surface protective tape 1. Preferably, the recessed portions of the roughness 5 may be formed at depths so as to not penetrate through the base material layer 3 and while not particularly limited hereto, the height difference of the roughness 5 formed in the base material layer 3, for example, may be set based on a surface roughness Ra and the maximum height Ry of the base material layer 3, whereby the roughness 5 may be formed in the base material layer 3, at a depth such that the recessed portions of the roughness 5 do not penetrate through the base material layer 3.

In particular, for example, in an instance in which the surface roughness Ra of the base material layer 3 is on average about 2.00 μm, a maximum height (maximum height difference) Ry of the roughness 5 formed in the base material layer 3 is about 15.00 μm. In an instance in which the surface roughness Ra of the base material layer 3 is on average about 3.50 μm, the maximum height Ry of the roughness 5 formed in the base material layer 3 is about 20.00 μm (refer to JIS B 0601-1994 for definitions of the surface roughness Ra and the maximum height Ry). Therefore, in an instance in which the thickness of the base material layer 3 is about 30 μm, the height difference of the roughness 5 formed in the base material layer 3, for example, may be in a range of a few μm to about 10 μm.

Configuration may be such that the stage 25 on which the semiconductor wafer 10 is attached during the process at step S9 has a recess 26 formed at the surface thereof in a center portion where the semiconductor wafer 10 is placed, thus, the thickness of only the center portion is reduced leaving the thickness of the outer peripheral portion of a predetermined width as is in a rib-like shape so that only a surface 25a of the outer peripheral portion is attached to and supports the front surface 12a of the outer peripheral portion 12 of the semiconductor wafer 10 (refer to FIG. 13). In this instance, the stage 25 is configured to be apart from (free from contact with) the front-surface device structures of the semiconductor wafer 10. Therefore, in the process at step S9, when the mold 21 is pressed against the base material layer 3 of the back surface protective tape 1, an application of pressure to the front-surface device structures of the semiconductor wafer 10 is prevented.

Next, as depicted in FIGS. 6 and 7, the semiconductor wafer 10 is placed on a non-depicted stage for applying the perimeter protective tape, the semiconductor wafer 10 being placed with the back surface 10b facing downward (facing the stage). Next, under atmospheric pressure, the perimeter protective tape (second tape) 2 is adhered to the outer peripheral portion 12 of the semiconductor wafer 10 by an adhesive layer 7 of the perimeter protective tape 2 (step S10: fourth process). The perimeter protective tape 2 is adhered spanning the front surface 10a of the semiconductor wafer 10 and the back surface 10b so as to cover the side surface 10c of the semiconductor wafer 10. Here, by non-depicted roller or the like, the perimeter protective tape 2 is mechanically pressed to the semiconductor wafer 10, whereby adhesion between the semiconductor wafer 10 and the perimeter protective tape 2 may be increased.

The perimeter protective tape 2 has, in a plan view, a substantially rectangular band-like shape that is longer than a perimeter (circumference) of the semiconductor wafer 10. A first end of the perimeter protective tape 2 in a lateral direction thereof is positioned on the front surface 10a of the semiconductor wafer 10 while a second end in the lateral direction is positioned on the back surface protective tape 1 in the back surface flat portion 12b of the outer peripheral portion 12 of the semiconductor wafer 10, whereby the perimeter protective tape 2 covers the side surface 10c of the semiconductor wafer 10 and chamfered portions (not assigned a reference character). The chamfered portions of the semiconductor wafer 10 are a substantially arc-shaped portion between the front surface 10a of the semiconductor wafer 10 and the side surface 10c, and a substantially arc-shaped portion between the back surface 10b of the semiconductor wafer 10 and the side surface 10c.

The first end of the perimeter protective tape 2 in the lateral direction thereof is positioned on the front surface 12a of the outer peripheral portion 12 of the semiconductor wafer 10 so as to be apart from (not reach) the center portion 11 of the semiconductor wafer 10. The second end of the perimeter protective tape 2 in the lateral direction thereof overlaps the base material layer 3 of the back surface protective tape 1 so as to completely cover the back surface flat portion 12b of the outer peripheral portion 12 of the semiconductor wafer 10. Further, while the second end of the perimeter protective tape 2 in the lateral direction thereof may preferably be aligned with and overlap an inner end of the back surface flat portion 12b of the outer peripheral portion 12 of the semiconductor wafer 10 (the inner end being at border between the back surface flat portion 12b and the mesa edge 13b of the recess 13 and facing the center portion 11), the second end of the perimeter protective tape 2 in the lateral direction thereof may protrude toward the mesa edge 13b of the recess 13.

Further, the perimeter protective tape 2, in a longitudinal direction thereof, is applied so as to circle the outer periphery of the semiconductor wafer at least one time. Third and fourth end portions of the perimeter protective tape 2 in the longitudinal direction thereof may preferably overlap each other by a predetermined amount. As a result, adhesion of the third and fourth end portions of the perimeter protective tape 2 in the longitudinal direction thereof may be assured. Further, the third end portion (hereinafter, protruding part, refer to FIGS. 9 and 10) 2a of the perimeter protective tape 2 in the longitudinal direction thereof that overlaps the fourth end portion may be left protruding. The protruding part 2a of the perimeter protective tape 2 is left protruding, whereby during the process at later-described step S13, peeling of the perimeter protective tape 2 is facilitated.

As a result, the perimeter protective tape 2 is applied at the side surface 10c of the semiconductor wafer 10, spanning from the front surface 10a of the semiconductor wafer 10 to the back surface 10b, whereby an entire area of the side surface 10c of the semiconductor wafer 10 is covered and protected by the perimeter protective tape 2. Further, the perimeter protective tape 2 is applied directly to the front surface 12a of the outer peripheral portion 12 of the semiconductor wafer 10 (or the insulating layer on the front surface 12a of the outer peripheral portion 12) and is applied to the roughness 5 of the base material layer 3 of the back surface protective tape 1 on the back surface flat portion 12b of the outer peripheral portion 12 of the semiconductor wafer 10.

The perimeter protective tape 2 has a layered structure in which the adhesive layer 7 is stacked on a base material layer 6 (refer to FIG. 7, layered structure not depicted in FIG. 6, 9, or 10) and is applied to the semiconductor wafer 10 by the surface (adhesive surface) having the adhesive layer 7. As the perimeter protective tape 2, a commercial tape that is heat resistant, chemical resistant, and developed for plating treatment processes may be used. A total thickness of the perimeter protective tape 2 is thicker than a total thickness of the back surface protective tape 1 and, for example, is about 130 μm±10 μm. Before use, the perimeter protective tape 2, for example, is stored rolled with a protective film (non-depicted polyester film with mold-releasing property) therebetween, similarly to the back surface protective tape 1 before use (refer to FIG. 8).

The base material layer 6 is a pressure-sensitive tape that is flexible so as to be bent according to the cross-sectional shape of the outer peripheral portion 12 of the semiconductor wafer 10 and has plasticity to maintain the shape in a bent state. Further, the base material layer 6 is a barrier film containing a resin that is heat resistant and chemical resistant with respect to the plating solution used in the plating treatment at later-described step S12. In particular, the base material layer 6 is, for example, a polyolefin (PO) based film. A thickness of the base material layer 6 is, for example, about 80 μm. The adhesive layer 7, for example, is formed by an acrylic-based adhesive (resin). A thickness of the adhesive layer 7 is, for example, about 50 μm.

The adhesive layer 7 deforms along the roughness 5 of the surface of the base material layer 3 of the back surface protective tape 1 on the back surface flat portion 12b of the outer peripheral portion 12 of the semiconductor wafer 10, and is embedded in recessed portions of the roughness 5 (in FIG. 6, the adhesive layer 7 in recessed portions of the roughness 5 not depicted). Therefore, due to the anchor effect (effect of increasing adhesion by an adhesive penetrating between fine recessed portions and protruding portions constituting roughness and then being cured) between the roughness 5 of the surface of the base material layer 3 of the back surface protective tape 1 and the adhesive layer 7 of the perimeter protective tape 2, the adhesion between the back surface protective tape 1 and the perimeter protective tape 2 may be enhanced. The protective film of the perimeter protective tape 2 is peeled from the perimeter protective tape 2 immediately before the process at step S10.

In this manner, due to the anchor effect, adhesion of the perimeter protective tape 2 at the back surface 10b of the semiconductor wafer 10 is enhanced and the adhesion of the perimeter protective tape 2 is balanced between the front surface 10a and the back surface 10b of the semiconductor wafer 10. Balancing the adhesion of the perimeter protective tape 2 means that the adhesive strength of the perimeter protective tape 2 is substantially equal at the front surface 10a and the back surface 10b of the semiconductor wafer 10. For example, the pattern of the roughness 5 of the surface of the base material layer 3 of the back surface protective tape 1 is set in advance so that the adhesion of the perimeter protective tape 2 is balanced between the front surface 10a and the back surface 10b of the semiconductor wafer 10.

Next, the semiconductor wafer 10, in a state with the back surface protective tape 1 and the perimeter protective tape 2 applied thereto, is heated (tape annealing) (step S11: fifth process). By the tape annealing, the back surface protective tape 1 and the perimeter protective tape 2 are heated and the adhesive layers 4, 7 of these protective tapes become soft, whereby the adhesive layers 4, 7 are embedded in and adhered to fine gaps between the surface below (adhered surface) and the adhesive layers 4, 7, thereby increasing the adhesion between the semiconductor wafer 10 and, the back surface protective tape 1 and the perimeter protective tape 2, and increasing the adhesion between the base material layer 3 of the back surface protective tape 1 and the adhesive layer 7 of the perimeter protective tape 2.

The tape annealing at step S11 may be a lamp heating treatment of directly heating an object by a heating mechanism such as an infrared lamp, a lamp heater, etc., or may be an atmosphere heat treatment in which an object is exposed to a heated atmosphere and indirectly heated. In an instance in which the tape annealing is a lamp heating treatment, for example, the semiconductor wafer 10 may be placed in a heating furnace (non-depicted oven furnace), whereby the back surface protective tape 1 and the perimeter protective tape 2 are directly heated or the semiconductor wafer 10 may be placed on a stage (non-depicted hotplate) heated by heating a mechanism, whereby the back surface protective tape 1 and the perimeter protective tape 2 may be directly or indirectly heated.

Further, as for the tape annealing at step S11, for example, multiple semiconductor wafers 10 may be placed in a wafer cassette and collectively processed in batches, or the semiconductor wafer 10 may be processed singularly, one at a time. For example, the tape annealing at step S11 is performed in batches using a heating furnace, whereby the adhesion between the back surface protective tape 1 and the perimeter protective tape 2 is enhanced and throughput may be enhanced. While not particularly limited hereto, the tape annealing at step S11, for example, may be performed for about 15 minutes at a temperature of about 80 degrees C. or, for example, may be performed for 15 minutes at a temperature of about 60 degrees C.

In the conventional method (refer to FIGS. 15 and 16), the perimeter protective tape 102, at the back surface 110b of the semiconductor wafer 110, is applied to the back surface protective tape 101, which has low adhesion in terms of material properties. Thus, before the plating treatment, the tape annealing is performed under a relatively high temperature (about 70 degrees C. to 80 degrees C.) for a relatively long time (about 30 minutes) and while the tape annealing enhances the adhesion between the back surface protective tape 101 and the perimeter protective tape 102 overlapping the back surface protective tape 101 at the back surface 112b of the outer peripheral portion 112 of the semiconductor wafer 110, the tape annealing causes the adhesion between the perimeter protective tape 102 and the front surface 112a of the outer peripheral portion 112 of the semiconductor wafer 110 to become exceedingly strong.

On the other hand, in the embodiment, as described above, the adhesion between the back surface protective tape 1 and the perimeter protective tape 2 is enhanced by the anchor effect, whereby a total amount of thermal energy applied to the perimeter protective tape 2 by the tape annealing may be reduce. Thus, as compared to the convention method, tape annealing conditions are relaxed and the temperature or the period (or both) of the tape annealing is reduced. Further, as described above, adhesion of the perimeter protective tape 2 is balanced between the front surface 10a and the back surface 10b of the semiconductor wafer 10 and thus, the adhesion of the perimeter protective tape 2 at the front surface 10a of the semiconductor wafer 10 may be prevented from becoming exceedingly strong due to tape annealing.

In this manner, the perimeter protective tape 2 is free of areas where the adhesion is exceedingly high and therefore, the adhesive layer 7 of the perimeter protective tape 2 may be prevented from being partially left on the surface of the semiconductor wafer 10 (adhesive residue). Conditions (temperature, time) of the tape annealing at step S11 are obtained in advance (refer to FIG. 14) so that the adhesion between the back surface protective tape 1 and the perimeter protective tape 2 is enhanced to an extent that the plating solution used in the plating treatment at later-described step S12 does not reach the semiconductor wafer 10 and enhancement of the adhesion of the perimeter protective tape 2 is controlled to an extent so that the surface of the semiconductor wafer 10 is free of adhesive residue of the adhesive layer 7 of the perimeter protective tape 2.

For example, the inventor confirmed that when the tape annealing increases the adhesion of the perimeter protective tape 2 to the semiconductor wafer 10 by 20% or more relative to a specification, the perimeter protective tape 2 becomes difficult to peel from the semiconductor wafer 10 and adhesive residue of the adhesive layer 7 tends to occur. A specification of the adhesion of the perimeter protective tape 2 is a peel strength (adhesive strength of the adhesive layer 7) of the perimeter protective tape 2 when applied to the semiconductor wafer 10 at room temperature (for example, 25 degrees C.). Therefore, based on temperature dependency and/or verification results of the peel strength of the perimeter protective tape 2, tape annealing conditions are obtained in advance so that adhesive residue of the adhesive layer 7 of the perimeter protective tape 2 does not occur.

Next, the semiconductor wafer 10, in a state with the back surface protective tape 1 and the perimeter protective tape 2 applied thereto, for example, is immersed in plating solution (chemical solution) of a temperature of about 70 degrees C. to 80 degrees C. and the plating treatment, for example, is performed for about 40 minutes to 50 minutes by an electroplating method or an electroless plating method, whereby at the surface of a non-depicted front electrode of the semiconductor wafer 10, for example, a Ni plated film and an Au plated film are sequentially formed (step S12: sixth process). As described above, the adhesion between the back surface protective tape 1 and the perimeter protective tape 2 is enhanced by the tape annealing and thus, peeling of the back surface protective tape 1 and the perimeter protective tape 2 is suppressed during the process at step S12.

Next, as depicted in FIGS. 9 and 10, the perimeter protective tape 2 is peeled from the outer peripheral portion 12 of the semiconductor wafer 10 (step S13). In particular, in the process at step S13, the semiconductor wafer 10 is placed on and fixed to a non-depicted stage that enables attachment and has a circular shape in a plan view, the semiconductor wafer 10 being fixed thereto with the back surface 10b facing downward (toward the stage). Subsequently, the protruding part 2a of the perimeter protective tape 2 is pulled and in a direction 9b opposite to a direction 2b in which the protruding part 2a is pulled, the stage is rotated along the circumference thereof with a column-shaped support 9 for holding the stage, as a center-axis, whereby the perimeter protective tape 2 is peeled from the semiconductor wafer 10.

Next, the back surface protective tape 1 is peeled from the back surface of the semiconductor wafer 10 (step S14). In particular, the semiconductor wafer 10 is placed on a non-depicted stage, with the front surface 10a facing the stage. Next, UV light, which is not depicted, is irradiated on the back surface protective tape 1 from the back surface 10b of the semiconductor wafer thereby curing the adhesive layer 4 of the back surface protective tape 1, whereby the adhesive strength (peel strength of the back surface protective tape 1) of the adhesive layer 4 of the back surface protective tape 1 is reduced. Subsequently, for example, a different non-depicted tape applied close to the end of the back surface protective tape 1 is lifted and pulled, thereby peeling the back surface protective tape 1.

As described above, it was confirmed by the inventor that without the adhesive layer 7 of the perimeter protective tape 2 partially remaining (adhesive residue) on the surface of the semiconductor wafer 10, the semiconductor wafer is, thereby, free of damage caused by adhesive residue (residue) of the adhesive layer 7 of the perimeter protective tape 2 during the process at step S13. Further, it was confirmed by the inventor that the adhesive layer 4 of the back surface protective tape 1 is cured by UV irradiation and thus, even when adhesive residue (residue) of the adhesive layer 4 of the back surface protective tape 1 is present on the back surface 10b of the semiconductor wafer at subsequent processes, the semiconductor wafer 10 is free of damage caused by the adhesive residue of the adhesive layer 4 of the back surface protective tape 1.

Thereafter, remaining processes are performed (step S15), whereby the semiconductor device according to the embodiment is completed. The remaining processes may be verification of electrical characteristics of the semiconductor wafer 10, a dicing process of dicing the semiconductor wafer 10 into individual semiconductor chips, verification of electrical characteristics of the semiconductor chips, etc.

As described above, according to the embodiment, in the plating treatment performed to the front electrode of the semiconductor wafer having rib-like shape, after the back surface protective tape is applied but before the perimeter protective tape is applied, fine roughness is formed only at the surface of the base material layer of the back surface protective tape on the back surface flat portion of the outer peripheral portion of the semiconductor wafer. The perimeter protective tape is applied directly to the front surface (or the insulating layer on the front surface of the outer peripheral portion) of the outer peripheral portion of the semiconductor wafer and is applied to the roughness of the base material layer of the back surface protective tape on the back surface flat portion of the outer peripheral portion of the semiconductor wafer.

Adhesion between resins, which have low adhesion in terms of material properties (adhesion between the back surface protective tape and the perimeter protective tape) may be enhanced by the anchor effect between the roughness of the surface of the base material layer of the back surface protective tape and the adhesive layer of the perimeter protective tape. As a result, the adhesion of the perimeter protective tape at the back surface of the semiconductor wafer is enhanced and thus, even when the adhesion of the perimeter protective tape to the front surface of the outer peripheral portion of the semiconductor wafer is strong, the adhesion of the perimeter protective tape is generally balanced between the front surface and the back surface of the semiconductor wafer.

Thus, even when the tape annealing is performed to enhance the adhesion between back surface protective tape and the perimeter protective tape, the adhesion of the perimeter protective tape at the front surface of the semiconductor wafer may be prevented from becoming exceedingly strong. Therefore, after peeling of the perimeter protective tape, adhesive residue (residue) of the adhesive layer of the perimeter protective tape does not remain on the surface of the semiconductor wafer. In the processes thereafter, damage to the semiconductor wafer caused by adhesive residue of the adhesive layer of the perimeter protective tape may be prevented and thus, yield may be enhanced.

Further, the adhesion between the back surface protective tape and the perimeter protective tape is enhanced by the anchor effect, whereby compared to the conventional method, the temperature and/or the time of the tape annealing may be reduced. Further, the embodiment facilitates roughening only a predetermined area of the surface of the base material layer of the back surface protective tape by the embossing process by a predetermined mold. The mold used in the embossing process may have roughness of a predetermined pattern at a predetermined area thereof and may ensure a suitable strength and therefore, for example, application is further possible to large-diameter semiconductor wafers of 8 inches or more.

FIG. 14 shows results of verification of the presence/absence of adhesive residue (residue) of the adhesive layer 7 of the perimeter protective tape 2 by performing the processes at step S1 to step S13 according to the method of manufacturing the semiconductor device according to the embodiment described above (refer to FIG. 1, hereinafter, "example"). FIG. 14 is a table depicting a relationship between tape annealing conditions and adhesive residue of the adhesive layer of the perimeter protective tape. For the example, samples were prepared by performing the tape annealing at step S11 at a temperature of 80 degrees C. for 15 minutes and by performing the tape annealing at step S11 at a temperature of 60 degrees C. for 15 minutes.

Figure 16:
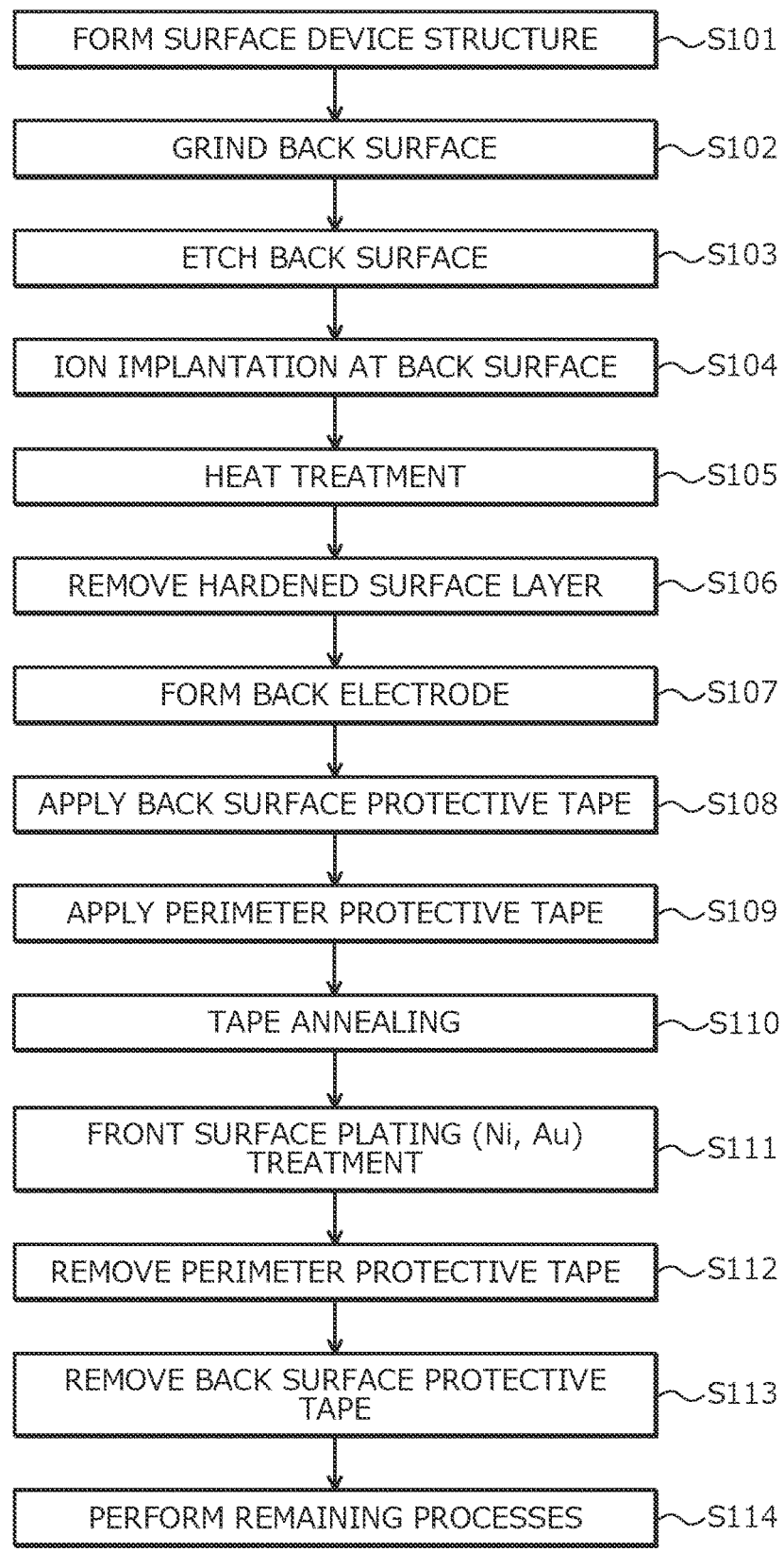
FIG. 16 is a flowchart depicting an outline of the conventional method of manufacturing the semiconductor device.

Further, FIG. 14 shows results of verification of the presence/absence of adhesive residue (residue) of the adhesive layer 106 of the perimeter protective tape 102 by performing the processes at step S101 to step S112 according to the conventional method of manufacturing the semiconductor device (FIGS. 15 and 16, hereinafter, "conventional example"). The conventional example differs from the example in that no roughness was formed at the surface of the base material layer 103 of the back surface protective tape 101 (the process at step S9 of the example is not performed) and the tape annealing at step S110 was performed at a temperature of 80 degrees C. for 30 minutes.

For both the example and the conventional example, tape annealing conditions (temperature, time) at steps S11 and S110 were set at conditions that increase the adhesion between the adhesive layer 106 of the perimeter protective tape 102 and the base material layer 103 of the back surface protective tape 101 at the back surface 10b, 110b of the semiconductor wafer 110 to an extent that during the plating treatment at steps S12, S111 thereafter, penetration of the plating solution from between the base material layer 3, 103 of the back surface protective tape 1, 101 and the adhesive layer 6, 106 of the perimeter protective tape 2, 102, to the surface of the semiconductor wafer 10, 110 may be prevented.

From the results shown in FIG. 14, adhesive residue of the adhesive layer 106 of the perimeter protective tape 102 was confirmed on the front surface 112a of the outer peripheral portion 112 of the semiconductor wafer 110 in the conventional example (adhesive residue: yes). On the other hand, in the example, adhesive residue of the adhesive layer 7 of the perimeter protective tape 2 was not found in any of the samples (adhesive residue: no). Further, in the example, the conditions of the tape annealing at step S11 were relaxed as compared to the conventional example, and it was confirmed that the temperature and/or the time of the tape annealing may be reduced.

Thus, in the example, is was confirmed that due to the anchor effect between the roughness 5 of the surface of the base material layer 3 of the back surface protective tape 1 and the adhesive layer 7 of the perimeter protective tape 2, adhesion of the perimeter protective tape 2 at the back surface 10b of the semiconductor wafer 10 is enhanced, and the adhesion of the perimeter protective tape 2 is generally balanced between the front surface 10a and the back surface 10b of the semiconductor wafer 10. It was confirmed that as a result, the amount of thermal energy necessary to enhance the adhesion between the back surface protective tape 1 and the perimeter protective tape 2 is reduced, and as compared to the conventional example, the tape annealing conditions may be relaxed.

In the foregoing, the present invention is not limited to the embodiments described and various modifications thereof are possible within a range not departing from the spirit of the invention. For example, without limitation to an embossing process by a mold, while the roughness of the surface of the base material layer of the back surface protective tape may be formed using various methods, an embossing process by which the roughness may be formed by merely pressing a mold to the surface of the base material layer of the back surface protective tape is the most useful for forming the roughness within a limited range of the surface of the base material layer of the back surface protective tape.

According to the invention described above, the adhesion of the second tape at the second main surface of the semiconductor wafer is enhanced and thus, in the outer peripheral portion of the semiconductor wafer, even when the adhesion of the second tape to the first main surface of the semiconductor wafer is high, the adhesion of the second tape is generally balanced between the first main surface and the second main surface of the semiconductor wafer. Thus, the adhesion of the second tape at the first main surface of the semiconductor wafer may be prevented from becoming excessively high and adhesive residue (residue) of the adhesive layer of the second tape does not occur, whereby damage of the semiconductor wafer may be suppressed.

The method of manufacturing the semiconductor device according to the present invention achieves an effect in that yield may be enhanced.

As described above, the method of manufacturing the semiconductor device according to the present invention is useful for power semiconductor devices used in power converting equipment, power source devices of various types of industrial machines, etc. and is particularly suitable for semiconductor devices fabricated (manufactured) using a FZ wafer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device having a first main surface and a second main surface that is opposite to the first main surface, the method comprising:

as a first process, forming a first electrode at the first main surface of the semiconductor wafer;

as a second process, applying a first tape to cover the second main surface of the semiconductor wafer;

as a third process, forming roughness at a portion of a surface of the first tape;

as a fourth process, applying a second tape to an outer peripheral portion of the semiconductor wafer, so as to cover the portion of the surface of the first tape, at which the roughness is formed in the third process, at the second main surface of the semiconductor wafer, to cover a portion of the first main surface of the semiconductor wafer, and to cover a side surface of the semiconductor wafer;

as a fifth process, heating the semiconductor wafer after the first tape and the second tape are applied; and as a sixth process, forming a plated film at the surface of the first electrode by a plating treatment after the fifth process.

2. The method, according to claim 1, wherein
in the third process, forming the roughness includes pressing a mold against the portion of the surface of the first tape.

3. The method according to claim 1, wherein in the third process,
the first tape includes a base material layer, and
a height difference of the portion of the surface of the first tape, after the roughness is formed, is less than a thickness of the base material layer.

4. The method according to claim 3, wherein
the height difference is not more than 10 μm.

5. The method according to claim 1, wherein
the semiconductor wafer further has a center portion, a thickness of the center portion being smaller than a thickness of the outer peripheral portion, thereby forming a rib-like shape, and
in the third process, the roughness is formed at a portion of the first tape covering the outer peripheral portion of the semiconductor wafer.

* * * * *